United States Patent [19]

Shimizu et al.

[11] Patent Number: 5,321,275
[45] Date of Patent: Jun. 14, 1994

[54] PHOTODETECTOR AND PHOTODETECTION METHOD

[75] Inventors: Akira Shimizu, Tokyo; Kazuhito Fujii, Kanagawa, both of Japan

[73] Assignee: Canon Kabushiki Kaisha, Tokyo, Japan

[21] Appl. No.: 1,228

[22] Filed: Jan. 6, 1993

Related U.S. Application Data

[63] Continuation of Ser. No. 659,685, Feb. 25, 1991, abandoned.

[30] Foreign Application Priority Data

Feb. 26, 1990 [JP] Japan ................... 2-045086
Jan. 19, 1991 [JP] Japan ................... 3-004767

[51] Int. Cl.$^5$ ................... H01L 27/14; H01L 31/00
[52] U.S. Cl. ................... 257/21; 257/23; 257/184; 257/436
[58] Field of Search ............... 357/30 E, 30 L; 257/9, 257/12, 14, 21, 23, 24, 184, 431, 436

[56] References Cited

U.S. PATENT DOCUMENTS

| | | | |
|---|---|---|---|
| 4,745,452 | 5/1988 | Sollner | 357/16 |
| 4,749,850 | 7/1988 | Chemla et al. | 357/24 LR |
| 4,761,620 | 8/1988 | Bar-Joseph et al. | 322/7.51 |
| 4,816,878 | 3/1989 | Kano et al. | 257/25 |
| 4,873,555 | 10/1989 | Coon et al. | 357/4 |
| 4,961,198 | 10/1990 | Ishino et al. | 357/16 |
| 5,063,419 | 11/1991 | Glaser et al. | 257/432 |
| 5,091,980 | 2/1992 | Ogawa et al. | 359/262 |

OTHER PUBLICATIONS

Koren, U. et al. "GaAs/InP Multiple Quantum Well Waveguide . . . " Appl. Phys. Lett. Feb. 1987 pp. 368-370.

Larsson, A., et al., "High-Speed Dual-Wavelength Demultiplexing and Detection . . . ", Appl. Phys. Lett. 49(5), Aug. 1986 pp. 233-235.

Database WPIL, No. 89-356302, dated May 11, 1989 re published Appln. Ser. No. 07/271,546.

Primary Examiner—Sara W. Crane
Attorney, Agent, or Firm—Fitzpatrick, Cella, Harper & Scinto

[57] ABSTRACT

Disclosed is a photodetector adapted to detect light having a predetermined level of photon energy, comprising: a first semiconductor layer, a second semiconductor layer having a quantum well or a quantum wire structure, a barrier layer provided between the first and second semiconductor layers, a device for applying voltage to the barrier layer and the first and second semiconductor layers in order to generate a tunnel current flowing through the barrier layer, and a device for detecting the tunnel current. The second semiconductor layer exhibits a plurality of quantized electron energy levels, the energy difference between which is slightly smaller or slightly larger than the photon energy of the detected light. Further, incidence of the detected light upon the second semiconductor layer causes the quantized electron energy levels to shift by the photo Stark effect, resulting in variation of the tunnel current.

53 Claims, 6 Drawing Sheets

PHOTODETECTOR AND PHOTODETECTION METHOD

This application is a continuation of application Ser. No. 07/659,685 filed Feb. 25, 1991, now abandoned.

BACKGROUND OF THE INVENTION

1. Field of the Invention

This invention relates to a photodetector adapted to detect the intensity of light, outputting an electric-current amount, and a photodetection method using the same and, in particular, to a photodetector which scarcely absorbs the detected light.

2. Description of the Related Art

Conventionally, p-i-n photodiodes, avalanche photodiodes, etc., have been known as photodetectors to detect the intensity of light by converting it to an electric signal.

These photodiodes, however, absorb the detected light, generating carriers from the energy of the light absorbed. Accordingly, the incident light is hardly allowed to pass through the photodetector. If such photodiodes are applied, for example, to a bus-type optical communication system in which signal light is received serially by a plurality of receivers, that photodiode of the receiver situated at the forefront position in the communication path will substantially absorb the signal light, resulting in virtually no light reaching the second and subsequent receivers onwards. Accordingly, it is necessary for each receiver to generate, by means of a semiconductor laser or the like, a signal light that is identical to the one it has received, transmitting the signal light thus generated to the next receiver.

SUMMARY OF THE INVENTION

This invention has been made with a view to eliminating the above-mentioned problem in the prior art. It is accordingly an object of this invention to provide a photodetector which is capable of detecting the intensity of light while scarcely attenuating the detected light, as well as a photodetection method using this photodetector.

In accordance with this invention, the above object is achieved by a photodetector adapted to detect light having a predetermined level of photon energy, comprising:

a first semiconductor layer;

a second semiconductor layer having a quantum well or a quantum wire structure and exhibiting a plurality of quantized electron energy levels, the energy difference between which is slightly smaller or slightly larger than the photon energy of the detected light;

a barrier layer provided between the first and second semiconductor layers;

a means for applying voltage to the barrier layer and the first and second semiconductor layers in order to generate a tunnel current flowing through the barrier layer; and a means for detecting the tunnel current;

wherein incidence of the detected light upon the second semiconductor layer causes the quantized electron energy levels to shift by the photo Stark effect, resulting in variation of the tunnel current.

In accordance with this invention, there is further provided a photodetection method using the above photodetector, comprising the steps of:

applying voltage to the barrier layer and the first and second semiconductor layers in order to generate a tunnel current flowing through the barrier layer;

allowing the detected light to strike the second semiconductor layer so as to cause the above-mentioned quantized electron energy levels to be shifted by the photo Stark effect; and measuring the amount of the tunnel current, which varies with the shift of the electron levels.

DETAILED DESCRIPTION OF THE PREFERRED EMBODIMENT

Figure 1:
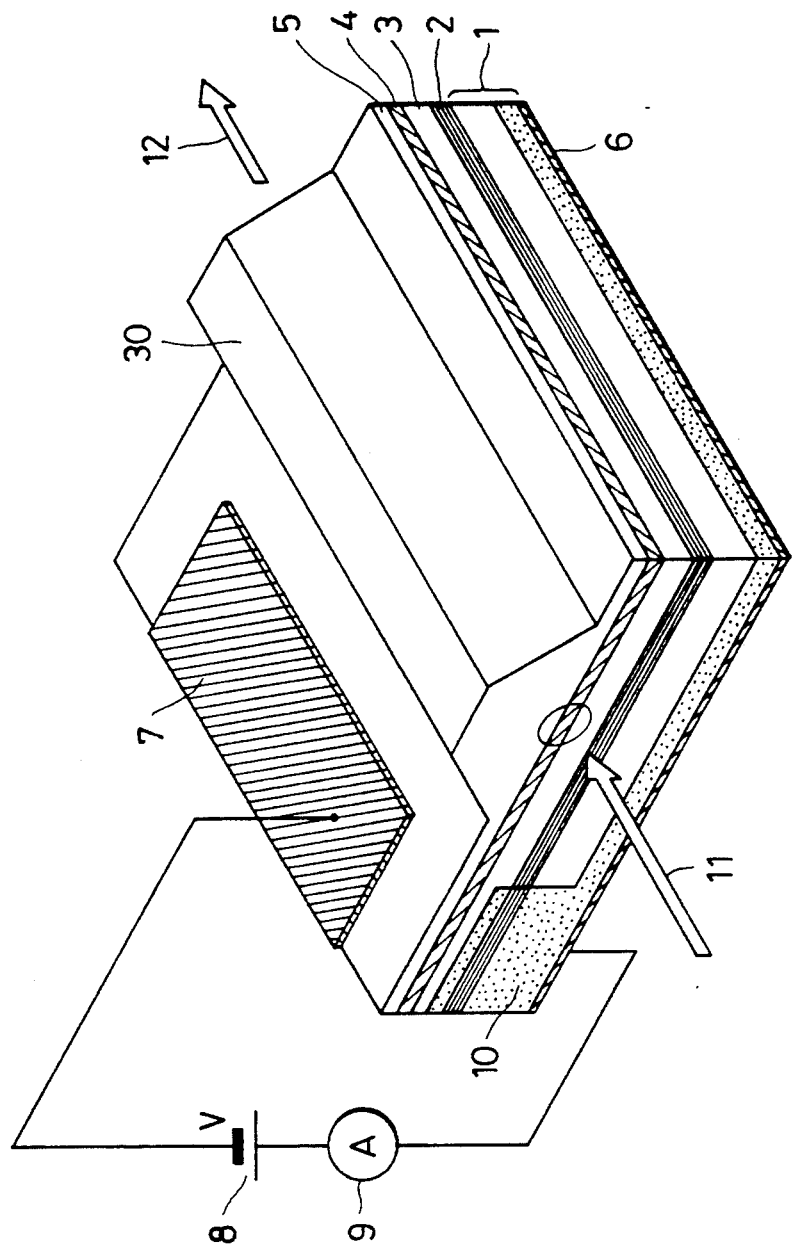
FIG. 1 is a schematic perspective view showing an embodiment of the photodetector of this invention.
Figure 2:
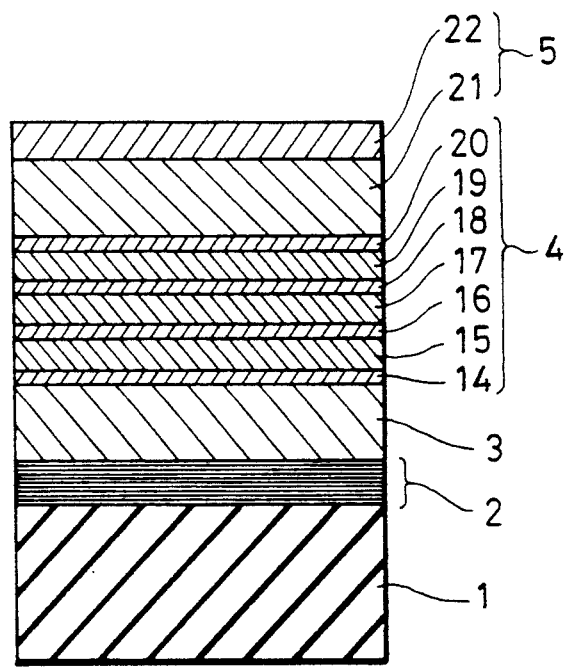
FIG. 2 is a schematic sectional view showing the layer structure of the above embodiment.

FIG. 1 is a schematic perspective view showing an embodiment of the photodetector of this invention, and FIG. 2 is a schematic sectional view showing the layer structure of this embodiment.

Referring to FIGS. 1 and 2, the embodiment shown includes an n-type GaAs substrate 1, a superlattice buffer layer 2, a first n-GaAs layer 3, a photodetection layer 4 having a multiple quantum well structure, and a second n-GaAs layer 5. The photodetection layer 4 is composed of an undoped (i-) AlAs layer 14, a first i-GaAs well layer 15, a first i-AlAs barrier layer 16, a second i-GaAs well layer 17, a second i-AlAs barrier layer 18, a third i-GaAs well layer 19, and an i-AlAs layer 20. The second n-GaAs layer 5 is composed of an n-GaAs layer 21 and an n-GaAs cap layer 22 whose impurity concentration is higher than that of the layer 21.

As shown in FIG. 1, formed on the second n-GaAs layer 5 is a stripe-like projection 30 extending in the incidence direction of the detected light 11. That section of the photodetection layer 4 which is under this projection 30 exhibits an effective refractive index that is higher than that of the other sections thereof, forming a channel-type waveguide. The detected light 11 strikes one end surface of the photodetection layer 4 and is propagated through this waveguide exiting from the other end surface of the photodetection layer 4 as the transmitted light 12.

Formed over the entire bottom surface of the substrate 1 is a first electrode 6 consisting of Au/Cr. To effect ohmic contact with this electrode 6, a portion of the substrate 1, the buffer layer 2 and the first n-GaAs layer 3 each are formed as a region 10 in which Au and Cr are diffused. Formed on the second n-GaAs layer 5 is a second electrode 7. To protect, as far as possible, the section through which the detected light is transmitted from encroachment by impurities, the electrode 7 is formed on a part of the surface area of the second n-GaAs layer 5 excluding the projection 30. Voltage is applied between the electrodes 6 and 7 from a voltage source 8 connected to them from outside. Further, an ammeter 9 measures the current flowing through the electrodes 6 and 7.

It will be apparent that any suitable means for measuring the flow of electrons through the structure (tunneling current) may be employed. For example, there are known d'Arsonval ammeters, digital (integrating) ammeters, current to voltage converters, current to frequency converters, photooptical converters, thermoelectric converters, quantum effect devices, etc. Since the present detector is constructed of a monolithic semiconductor, it is also apparent that the change in current produced by the detected light could be processed on the same substrate. Further, semiconductors such as gallium arsenide and indium phosphide are suitable for use in quantum well lasers and electrooptic modulators. Thus, the present photodetector may allow for efficient optical computers to be constructed.

Because the current flowing through the photodetector is related to the light incident on the quantum well or quantum wire structure, variations in light intensity may be used to convey information. However, the structure may also be used to detect digital signals through the presence or absence of light.

A semiconductor device used in the above-described photodetector was prepared as shown in FIGS. 1 and 2 (not drawn to scale), for example, as follows:

First, GaAs and AlAs layers each having a thickness of several Å to several tens of Å were alternately laminated on the surface (100) of the n-GaAs substrate 1, thereby forming a superlattice buffer layer 2 having a total thickness of 0.5 μm. Next, successively grown on this buffer layer 2 were a 0.5 μm thick n-GaAs layer 3, a 20 Å thick i-AlAs layer 14, a 40 Å thick i-GaAs well layer 15, a 22 Å thick i-AlAs barrier layer 16, a 43 Å thick i-GaAs well layer 17, a 22 Å thick layer AlAs barrier layer 18, a 40 Å thick i-GaAs well layer 19, and and a 20 Å thick i-AlAs layer 20. Subsequently, grown on the i-AlAs layer 20 were a 0.5 μm thick n-GaAs layer 21, and a 0.3 μm thick n-GaAs cap layer 22. The formation of these semiconductor layers was effected by the molecular beam epitaxy (MBE) method. Further, the concentration of the Si with which the n-type semiconductor layers were doped was controlled such that it is $1 \times 10^{18}$ cm$^{-3}$ in the n-GaAs layer 3 and $1 \times 10^{19}$ cm$^{-3}$ in the n-GaAs cap layer 22.

Next, mesa etching was performed on part of the semiconductor layer 5, leaving a stripe-like region, thereby forming the projection 30. Then, an Au and a Cr film were deposited by evaporation on the bottom surface of the substrate 1, thereby forming the electrode 6. Afterwards, the substrate 1 was placed in a hydrogen atmosphere at 400° C. so as to diffuse the Au and Cr, thereby forming the region 10. Further, an Au and a Cr film were deposited by evaporation on a part of the semiconductor layer 5, thereby forming the electrode 7.

Figure 3:
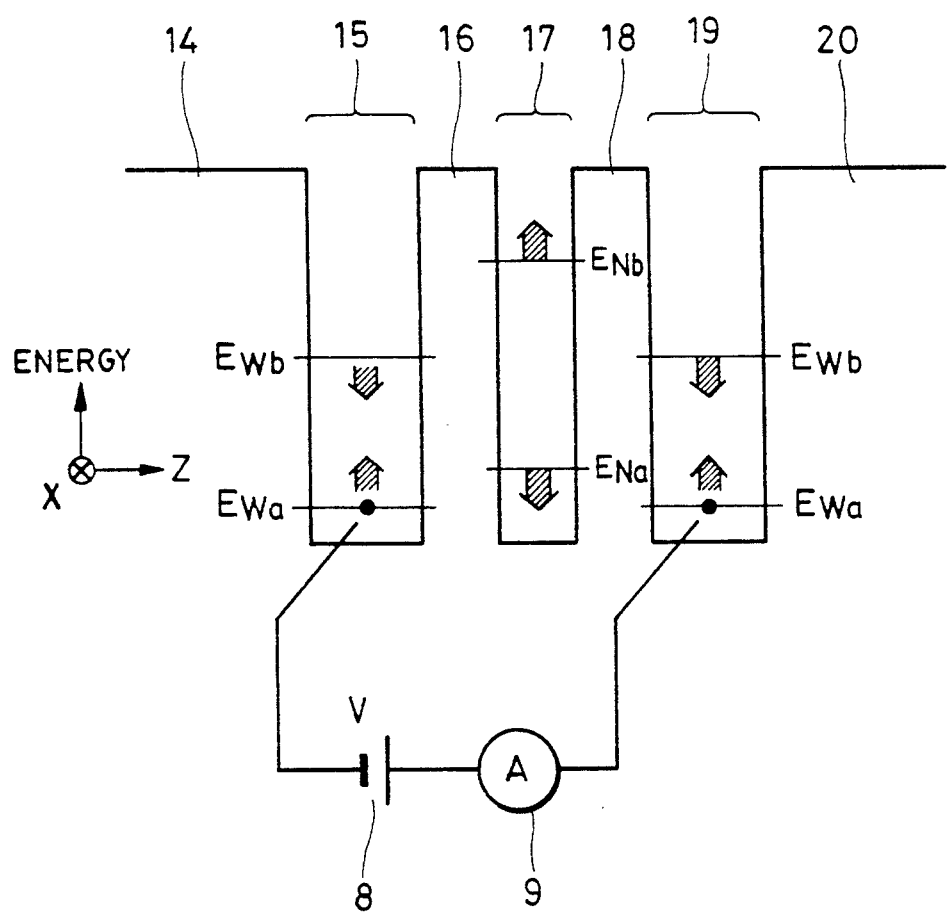
FIG. 3 is a schematic diagram showing the potentials in the above embodiment.

FIG. 3 is a diagram schematically representing the potentials in the photodetection layer 4 in the above-described embodiment. The respective potentials of the layers are indicated by the same reference numerals as those used in FIG. 2. Since the well layers 15, 17 and 19 are formed sufficiently thin, sub-bands are generated by the quantum size effect. That is, each of the well layers has a plurality of discrete electron energy levels. Here, the thickness, etc. of the well layer 17 is so adjusted that the energy difference between the electron energy levels of this well layer 17 is slightly larger than the photon energy of the detected light. Further, the thickness, etc. of the well layers 15 and 19 is so adjusted that the energy difference between the quantized electron energy levels of these well layers is slightly smaller than the photon energy of the detected light. Thus, assuming that the respective intrinsic energies of the sub-bands of the well layer 17, starting from the smallest one, are ENa, ENb, ..., that the respective intrinsic energies of the sub-bands of the well layers 15 and 19, starting from the smallest one, are Ewa, Ewb, ..., and that the photon energy of the detected light is ω, the following expressions are satisfied:

$$E_{Wb} - E_{Wa} < h\omega < E_{Nb} - E_{Na} \quad (1)$$
$$h\omega = E_{Wb} - E_{Wa} - \delta_W \quad (2)$$
$$h\omega = E_{Nb} - E_{Na} - \delta_N \quad (3)$$
$$|\delta_W| << h\omega \quad (4)$$
$$|\delta_N| << h\omega \quad (5)$$

where $\delta W < 0$ and $\delta N > 0$. In the embodiment described above, adjustment is effected such that Ewb−EWa= −422 meV and that ENb−ENa=465 meV, assuming that the wavelength of the detected light is 2.8 μm.

The above δW and δN are very small, so that, when the detected light strikes upon the well layers, the photo Stark effect is obtained. In this invention, light is detected by utilizing this photo Stark effect. As employed herein the phrase "photo Stark effect" has the same meaning as "optical Stark effect." In the following, the photo Stark effect will be explained. Generally, if, in an electron cloud of an atom, the electrons have separate energy levels, application of light having a photon energy whose level is near, if not identical, to that quantized electron energy level, causes the allowable energy levels of the electrons to be shifted. This phenomenon is called the photo Stark effect. In this invention, the "separate energy levels" means the energy levels of the sub-bands of a quantum well structure. Accordingly, in this invention, what is obtained is a photo Stark effect due to an imaginary inter-sub-band transition.

Assuming that the width of the first energy level in the well layer 17 is ΓNa and that the width of the first energy level in the well layers 15 and 19 is ΓWa, the following expressions are satisfied:

$$|E_{Wa} - E_{Na}| \geq \Gamma_{Wa} + \Gamma_{Na} \quad (6)$$

In the embodiment described above, the energy difference between Ewa and ENa is specified as 13.8 meV.

Semiconductor devices which satisfy the following conditional expressions will scarcely absorb the detected light:

$$|\delta W| \geq \Gamma_{Wa} + \Gamma_{Wb} \quad (7)$$
$$|\delta N| \geq \Gamma_{Na} + \Gamma_{Nb} \quad (8)$$
$$h\omega >> h\omega LO \quad (9)$$

where $h\omega LO$ represents a longitudinal optical (LO) phonon energy. Among the various types of phonons, including transverse-wave and longitudinal-wave phonons of acoustic mode, the LO phonon has the maximum vibrational energy. Therefore, if the photon energy of a detected light is larger than this LO phonon energy, the phonon absorption of the detected light will be reduced to a negligible degree. This condition is satisfied, for example, in a quantum well structure (QWS) which has a well layer having a relatively small thickness of several tens of Å, and which is composed of alternate GaAs/AlAs layers. Thus, the above-described structure detects light while absorbing only a small amount.

Figure 4:
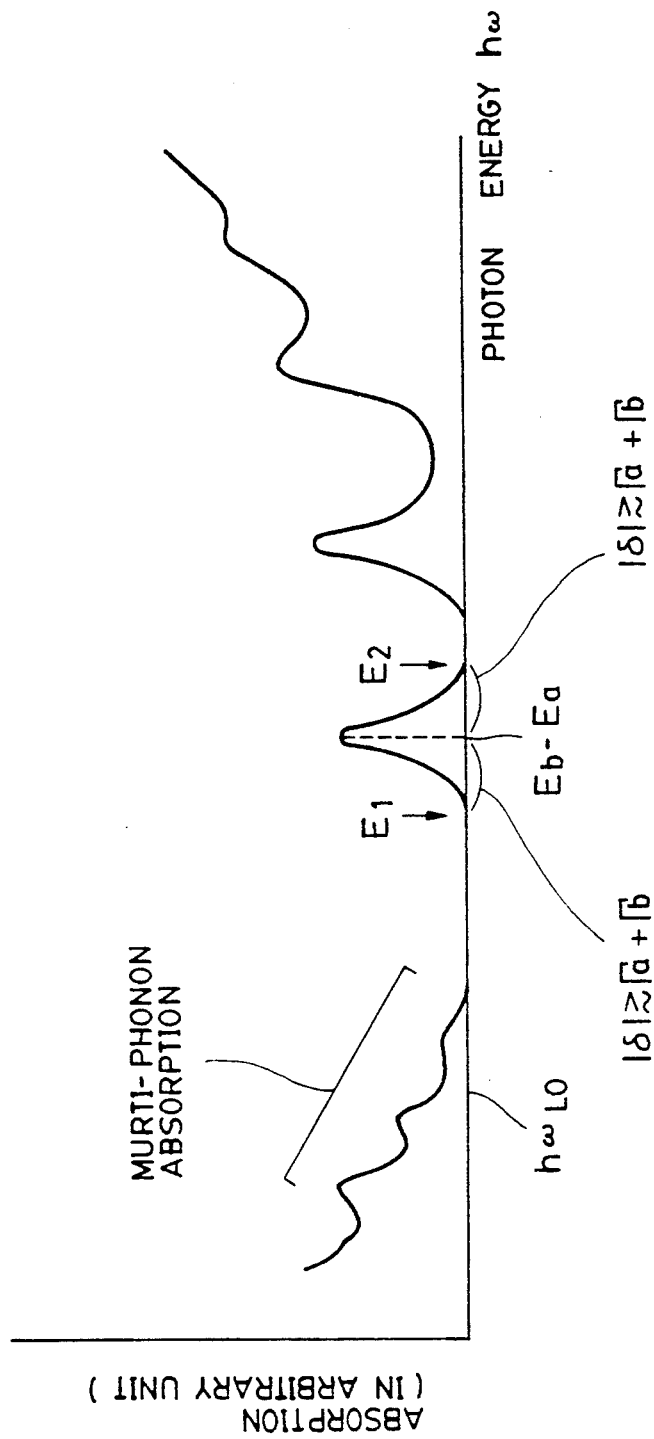
FIG. 4 is a diagram showing the photoabsorption spectrum of the photodetector in the above embodiment.

Graphically, the above condition may be expressed as an absorption spectrum as shown in FIG. 4, in which the horizontal axis represents photon energy and the vertical axis absorption. Ea represents the first level intrinsic energy of a QWS well layer having conductive carriers, and Eb the second level intrinsic energy of the same. Γa is the width of the first level energy of this well layer, and Γb the width of the second level energy of the same. Here, the photon energy of the detected light is set at E1 or E2. The difference δ between E1 or E2 and Eb−Ea satisfies the expression: $|\delta| \geq \Gamma a + \Gamma b$.

In the following, the operation of this embodiment will be described.

First, the case will be considered where no light is incident upon the QWS shown in FIG. 3. Electrons supplied to the well layer 15 from the electrodes fall down to the first sub-band level Ea. Here, voltage V is applied between the well layers 15 and 19 from the voltage source 8, so that the electrons are inclined to tunnel from the well layer 15 to the well layer 19. In this embodiment, however, the first sub-band energy level ENa of the well layer 17 is sufficiently higher than the first sub-band energy level EWa of the well layers 15 and 19, i.e., the relationship represented by expression (6) is satisfied, so that the probability of tunneling is low. Thus, when no light is incident upon the QWS, scarcely any current flows, with the ammeter 9 measuring a small amount of current.

Next, the case will be considered where light is incident upon the QWS. To avoid multi-phonon absorption, free-carrier absorption, etc., this detected light is polarized in such a manner that its field vector is in the Z-axis direction, i.e., perpendicular to the surfaces of the semiconductor layers. At the same time, the sub-band spacing in the well layers is, as stated above, set at several times the LO phonon energy or more. Here, incidence of light upon the QWS causes the electron levels to shift in the following manner by the above-mentioned photo Stark effect:

$$ENa \rightarrow ENa - (e\mu N\, \epsilon)^2/\delta N \quad (10)$$

$$EWa \rightarrow EWa - (e\mu W\, \epsilon)^2/\delta W \quad (11)$$

where e represents the unit charge, ε the field intensity, μN the length of the transition dipole from the first to the second level of the well layer 17, and μW the length of the transition dipole from the first to the second level of the well layers 15 and 19.

Figure 5:
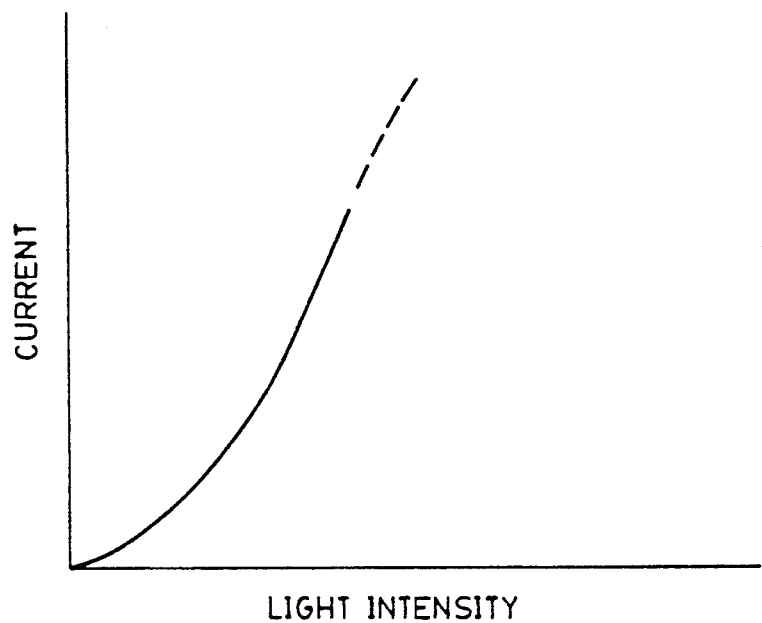
FIG. 5 is a diagram showing the relationship between the intensity of the detected light and the detection current in the above embodiment.

Since δW<0 and δN>0, the first level ENa of the well layer 17 and the first level EWa of the well layers 15 and 19 are, from the above expressions (10) and (11), respectively shifted to the lower and the higher side, as indicated by the arrows in FIG. 3. As a result, |ENa−EWa| becomes smaller (i.e., |ENa−EWa| <ΓWa+ΓNa), so that the probability of the electrons tunneling from the well layer 15 to the well layer 19 through the well layer 17 becomes higher, with the ammeter 9 measuring a current. The Stark shift amount of the above electron levels is proportional to the light intensity $\epsilon^2$, so that the amount of this current reflects the light intensity, which means the light intensity can be calculated backward from the current amount. FIG. 5 schematically shows the light-intensity/electric-current characteristic in this embodiment. In FIG. 5, the horizontal axis represents the intensity of light incident upon the photodetector, and the vertical axis represents the current detected.

Generally, in a composition of matter, the length of the dipole moment of the above inter-level shift is several Å at the most. In a QWS like the one of this embodiment, however, the length of the dipole moment is such that the well-layer size is several times larger than it, and it is as large as 10 Å or more. That is, the photo Stark effect due to the imaginary transition between sub-bands in the QWS is more intense than usual, which, combined with the above-described arrangement for making the field vector of light perpendicular to the surfaces of the semiconductor layers and the reduction of |δ| to a sufficient degree, greatly contributes to enhancement of the sensitivity of the photodetector of this invention.

While in the above-described embodiment EWa<ENa, the condition in which EWa>ENa, i.e., the condition in which the first level EWa of the well layers 15 and 19 is sufficiently higher than the first level ENa of the well layer 17, is also acceptable. In that case, the inequality sign in expression (1) is reversed, with the Stark shift direction being made reverse to that indicated by the arrows of FIG. 3. Thus, incidence of light causes the first level of well layers 15 and 19 to be lowered and that of the well layer 17 to be raised, resulting in the tunnel current being increased.

Further, in this invention, it may also be so arranged that, contrary to the case of expression (6), the following expression is satisfied:

$$|ENa - EWa| < \Gamma Wa + \Gamma Na \quad (12)$$

Figure 6:
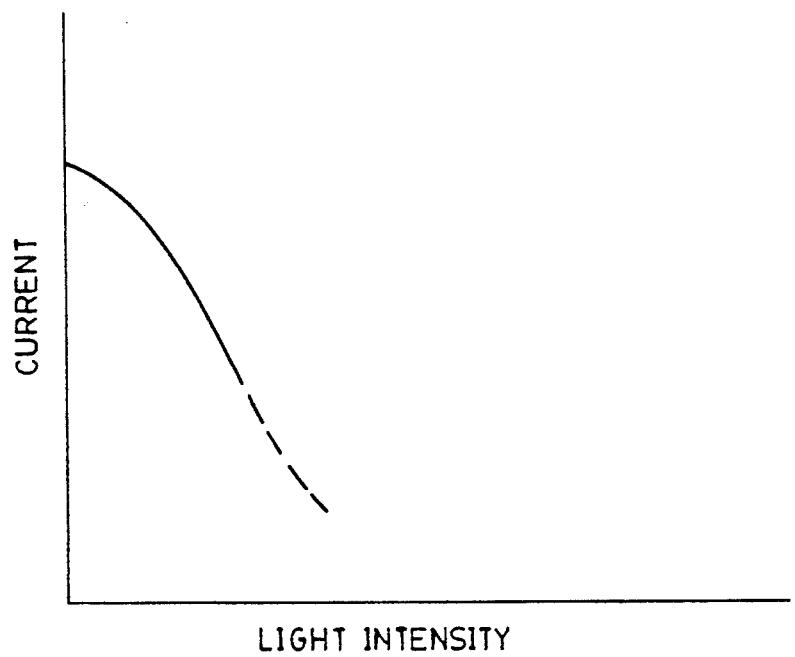
FIG. 6 is a diagram showing the relationship between the intensity of the detected light and the detection current in a second embodiment of this invention.

In that case, the characteristic the photodetector exhibits is such that a large current flows when no light is incident upon it, as shown in FIG. 6, with the current amount decreasing as the light intensity is increased. Further, in that case, the Stark shift direction may be the same as that in the case of FIG. 3 or reverse to it. In the former case, incidence of light causes the first level of the well layer 17 to become relatively low, resulting in reduction in the current amount. In the latter case, incidence of light causes the first level of the well layer 17 to become relatively high, resulting in reduction in the current amount.

Figure 7:
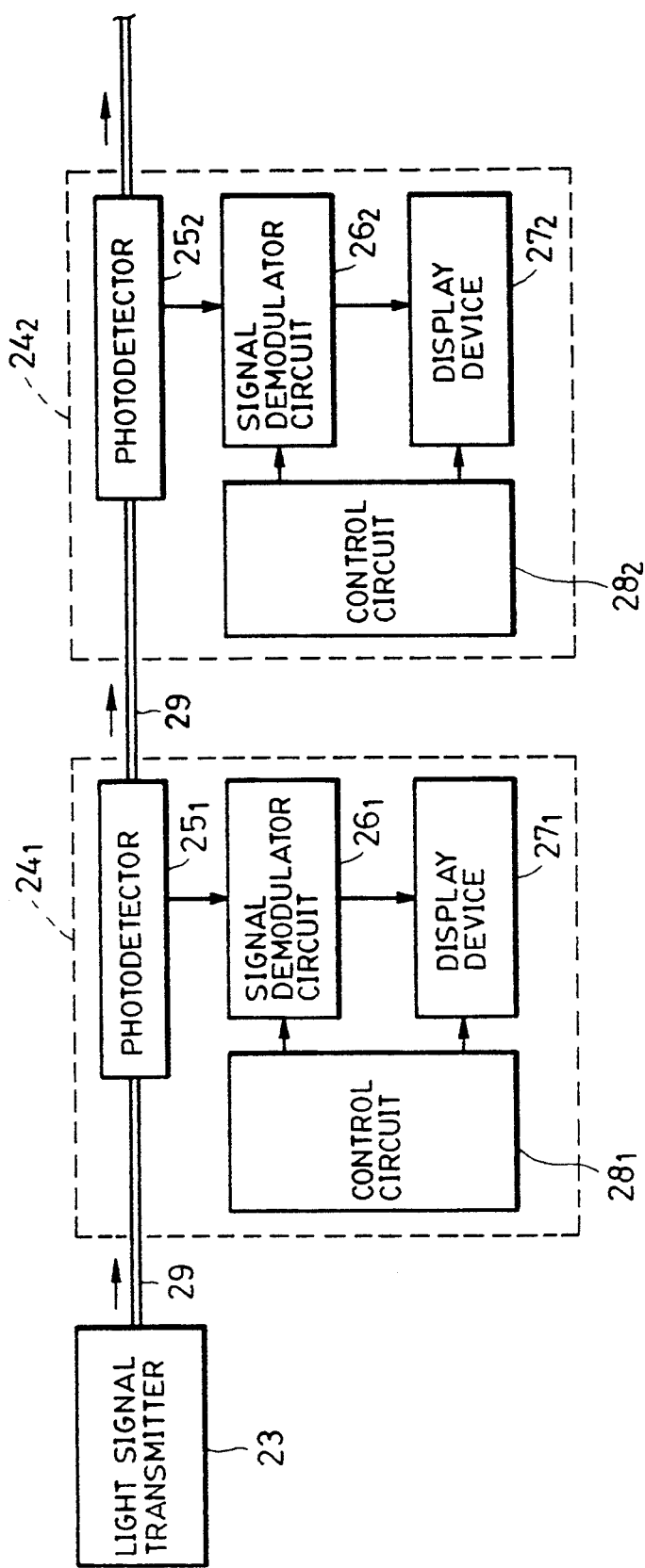
FIG. 7 is a block diagram showing a configuration example of an optical communication system using the photodetector of this invention.

FIG. 7 is a block diagram showing an example of an optical communication system using the photodetector of this invention. In FIG. 7, a light signal emitted from a light signal transmitter 23 is transmitted to a plurality of light signal receivers 241, 242, ... connected in series to each other through an optical fiber 29. The light signal receivers are respectively equipped with photodetectors 251, 252, ... each having a structure as shown in FIG. 1, the above-mentioned light signal being detected by these photodetectors. In this process, the photodetector 251, scarcely absorbs light, so that it allows the light signal to be transmitted to the photodetector 252 without attenuating it. The photodetector 252 also allows the light signal to be transmitted to the next photodetector without attenuating it. Thus, in an optical communication system using the photodetector of this invention, a plurality of receivers can be connected without providing a light signal amplifier in the transmission line or a light source in each receiver.

The signal detected by the photodetectors 251 and 252 is demodulated by signal demodulator circuits 261 and 262, and is displayed through display devices 271 and 272 consisting of cathode ray tubes (CRT), etc. Further, these signal demodulator circuits and display devices are controlled by control circuits 281 and 282.

Apart from the embodiment described above, this invention can be applied in a variety of ways. For example, while in the above embodiment the photodetector is formed by semiconductor layers having a quantum well structure (QWS), it is also possible to form the photodetector such that it has a quantum line structure (QLS) in which the semiconductor layers are formed as stripe-like portions having a minute width. It would be obvious that the present photodetector structure could be adapted to be formed as a quantum dot structure (QDS), which serves to confine the electrons in three dimensions. Further, while in the above embodiment three well layers are formed, the number of well layers may be more than three, or, alternatively, one or two. When only one well layer is formed, it may be so arranged that the difference between the electron level of this well layer and the potential of the semiconductor layer adjacent thereto through the intermediation of a barrier layer varies by the photo Stark effect. In the case where two well layers are formed, an improvement in sensitivity can be attained by forming them such that their respective Stark shift directions are different from each other. The present invention can be used to provide a differential output, by allowing the detected light to pass through a first structure that increases the tunneling current upon illumination with a light of a certain photon energy, and through a second structure that decreases the tunneling current upon illumination with a light of a certain photon energy. It will be obvious that, since light is hardly absorbed while passing through each structure, the present invention provides superior capabilities to photodetectors based on photodiodes. It will also be obvious that logical circuits may be constructed from the photodetector of the present invention, and that numerous photodetectors may be placed on a "bus" structure in order to facilitate optical computing. Further, the materials from which the semiconductor layers are fabricated are not limited to GaAs and AlAs. Various other materials may be adopted, including InGaAsP, ZnS, ZnTe, CdS, and CuCl. This invention embraces all such application examples insofar as they do not depart from the scope of the appending claims.

What is claimed is:

1. A photodetector adapted to detect light having a predetermined level of photon energy, comprising:

a first semiconductor layer having a quantum well or a quantum wire structure and exhibiting a first quantized electron energy level and a second quantized electron energy level higher than said first quantized electron energy level, the energy difference between said first and second quantized electron energy levels being slightly smaller than the photon energy of the detected light;

a second semiconductor layer having a quantum well or a quantum wire structure and exhibiting a third quantized electron energy level and a fourth quantized electron energy level higher than said third quantized electron energy level, the energy difference between said third and fourth quantized electron energy levels being slightly larger than the photon energy of the detected light;

a barrier layer provided between said first and second semiconductor layers;

a means for applying voltage to said barrier layer and said first and second semiconductor layers in order to generate a tunnel current flowing through said barrier layer; and a means for detecting said tunnel current;

wherein incidence of the detected light upon said first and second layers causes the quantized electron energy levels to shift by the optical Stark effect, resulting in variation of said tunnel current.

2. A photodetector according to claim 1, wherein the photon energy of said detected light is larger than the longitudinal optical phonon energy.

3. A photodetector according to claim 1, wherein the direction of the field vector of the detected light is perpendicular to the planes of said semiconductor layers.

4. A photodetector according to claim 1, wherein the amount of said tunnel current is increased as the intensity of the detected light is increased, satisfying the following conditional expression:

$$|E1-E3| \geq \Gamma 1 + \Gamma 3$$

where E1 represents the first level sub-band energy, E3 the third level sub-band energy, $\Gamma 1$ the first level energy width, and $\Gamma 3$ the third level energy width.

5. A photodetector according to claim 1, wherein the amount of said tunnel current is decreased as the intensity of the detected light is increased, satisfying the following conditional expression:

$$|E1-E3| < \Gamma 1 + \Gamma 3$$

where E1 represents the first level sub-band energy, E3 the third level sub-band energy, $\Gamma 1$ the first level energy width, and $\Gamma 3$ the third level energy width.

6. A photodetector adapted to detect light having a predetermined level of photo energy, comprising:

a first semiconductor layer having a quantum well or a quantum wire structure and exhibiting a first quantized electron energy level and a second quantized electron energy level, higher than said first quantized electron energy level;

a second semiconductor layer having a quantum well or a quantum wire structure and exhibiting a third quantized electron energy level and a fourth quantized electron energy level, higher than said third quantized electron energy level;

a barrier layer provided between said first and second semiconductor layers;

a means for applying voltage to said barrier layer and said first and second semiconductor layers in order to generate a tunnel current flowing through said barrier layer; and a means for detecting said tunnel current;

wherein, assuming that the sub-band energy of the first quantized electron energy level is $E_1$, that the sub-band energy of the second quantized electron energy level is $E_2$, that the sub-band energy of the third quantized electron energy level is $E_3$, that the sub-band energy of the fourth quantized electron energy level is $E_4$, and that the photon energy of the detected light is $\omega$, the following conditional expressions are satisfied, and wherein incidence of the detected light upon said first and second semiconductor layers causes the quantized electron energy levels to shift by the optical Stark effect, resulting in variation of said tunnel current:

$$E_2-E_1 < \omega < E_4-E_3$$

$$\hbar\omega = E_2-E_1-\delta_1$$

$$\hbar\omega = E_4-E_3-\delta_2$$

$$\delta_1 < 0$$

$$\delta_2 > 0$$

$$|\delta_1| >> \hbar\omega$$

$$|\delta_2| >> \hbar\omega.$$

7. A photodetector according to claim 6, wherein the direction of the field vector of the detected light is perpendicular to the planes of said semiconductor layers.

8. A photodetector according to claim 6, wherein the following conditional expressions are satisfied:

$$|\delta_1| \geq \Gamma_1+\Gamma_2$$

$$|\delta_1| \geq \Gamma_3+\Gamma_4$$

where $\Gamma_1$ represents the first level energy width, $\Gamma_2$ the second level energy width, $\Gamma_3$ the third level energy width, $\Gamma_4$ the fourth level energy width, and $\hbar\omega LO$ the longitudinal optical phonon energy.

9. A photodetector according to claim 8, wherein the amount of said tunnel current is increased as the intensity of the detected light is increased, satisfying the following condition expression:

$$|E_1-E_3| \geq \Gamma_1+\Gamma_3.$$

10. A photodetector according to claim 8, wherein the amount of said tunnel current is decreased as the intensity of the detected light is increased, satisfying the following conditional expression:

$$|E_1-E_3| < \Gamma_1+\Gamma_3.$$

11. A photodetector adapted to detect light having a predetermined level of photon energy, comprising:
a first semiconductor layer having a quantum well or a quantum wire structure and exhibiting a first quantized electron energy level and a second quantized electron energy level higher than said first quantized electron energy level, the energy difference between said first and second quantized electron energy levels being slightly smaller than the photon energy of the detected light;
a second semiconductor layer having a quantum well or a quantum wire structure and exhibiting a third quantized electron energy level and a fourth quantized electron energy level higher than said third quantized electron energy level, the energy difference between said first and second quantized electron energy levels being slightly larger than the photon energy of the detected light;
a third semiconductor layer having a quantum well or a quantum wire structure and exhibiting a fifth quantized electron energy level and a sixth quantized electron energy level higher than said fifth quantized electron energy level, the energy difference between said fifth and sixth quantized electron energy levels being slightly smaller than the photon energy of the detected light;
a first barrier layer provided between said first and second semiconductor layers;
a second barrier layer provided between said second and third semiconductor layers;
a means for applying voltage to said first and second barrier layers and said first, second and third semiconductor layers in order to generate a tunnel current flowing through said first and second barrier layers; and
a means for detecting said tunnel current;
wherein incidence of the detected light upon said first, second and third semiconductor layers causes the quantized electron energy levels to shift by the optical Stark effect, resulting in variation of said tunnel current.

12. A photodetector according to claim 11, wherein the photon energy of the detected light is larger than the longitudinal optical phonon energy.

13. A photodetector according to claim 11, wherein the direction of the field vector of the detected light is perpendicular to the planes of said semiconductor layers.

14. A photodetector according to claim 11, wherein the amount of said tunnel current is increased as the intensity of the detected light is increased, satisfying the following conditional expression.

$$|E_1-E_3| \geq \Gamma_1+\Gamma_3$$

$$|E_3-E_5| \geq \Gamma_3+\Gamma_5$$

where $E_1$ represents the first level sub-band energy, $E_3$ the third level sub-band energy, $E_5$ the fifth level sub-band energy, $\Gamma_1$ the first level energy width, $\Gamma_3$ the third level energy width, and $\Gamma_5$ the fifth level energy width.

15. A photodetector according to claim 11, wherein the amount of said tunnel current is decreased as the intensity of the detected light is increased, satisfying the following conditional expression:

$$|E_1-E_3| < \Gamma_1+\Gamma_3$$

$$|E_3-E_5| < \Gamma_3+\Gamma_5$$

where $E_1$ represents the first level sub-band energy, $E_3$ the third level sub-band energy, $E_5$ the fifth level sub-band energy, $\Gamma_1$ the first level energy width, $\Gamma_3$: the third level energy width, and $\Gamma_5$ the fifth level energy width.

16. A photodetector adapted to detect light having a predetermined level of photon energy, comprising:
a first semiconductor layer having a quantum well or a quantum wire structure and exhibiting a first quantized electron energy level and a second quantized electron energy level, higher than said first quantized electron energy level;
a second semiconductor layer having a quantum well or a quantum wire structure and exhibiting a third quantized electron energy level and a fourth quantized electron energy level, higher than said third quantized electron energy level;

a third semiconductor layer having a quantum well or a quantum wire structure and exhibiting a fifth quantized electron energy level and a sixth quantized electron energy level, higher than said fifth quantized electron energy level;

a first barrier layer provided between said first and second semiconductor layers;

a second barrier layer provided between said second and third semiconductor layers;

a means for applying voltage to said first and second barrier layers and said first, second and third semiconductor layers in order to generate a tunnel current flowing through said first and second barrier layers; and a means for detecting said tunnel current;

wherein, assuming that the sub-band energy of the first quantized electron energy level is E1, that the sub-band energy of the second quantized electron energy level is E2, that the sub-band energy of the third quantized electron energy level is E3, that the sub-band energy of the fourth quantized electron energy level is E4, that the sub-band energy of the fifth quantized electron energy level is E5, that the sub-band energy of the sixth quantized electron energy level is E6, and that the photon energy of the detected light is $\omega$, the following conditional expressions are satisfied, and wherein incidence of the detected light upon said first, second and third semiconductor layers causes the quantized electron energy levels to shift by the optical Stark effect, resulting in variation of said tunnel current:

$$E_2 - E_1 < \hbar\omega < E_4 - E_3$$

$$E_6 - E_5 < \hbar\omega$$

$$\hbar\omega = E_2 - E_1 - \delta_1$$

$$\hbar\omega = E_4 - E_3 - \delta_2$$

$$\hbar\omega = E_6 - E_5 - \delta_3$$

$$\delta_1 < 0$$

$$\delta_2 > 0$$

$$\delta_3 > 0$$

$$|\delta_1| << \hbar\omega$$

$$|\delta_2| << \hbar\omega$$

$$|\delta_1| << \hbar\omega.$$

17. A photodetector according to claim 16, wherein the direction of the field vector of the detected light is perpendicular to the planes of said semiconductor layers.

18. A photodetector according to claim 16, wherein the following conditional expressions are satisfied:

$$|\delta_1| \geq \Gamma_1 + \Gamma_2$$

$$|\delta_2| \geq \Gamma_3 + \Gamma_4$$

$$|\delta_3| \geq \Gamma_5 + \Gamma_6$$

$$\hbar\omega >> \hbar\omega LO$$

where $\Gamma_1$ represents the first level energy width, $\Gamma_2$ the second level energy width, $\Gamma_3$ the third level energy width, $\Gamma_4$ the fourth level energy width, $\Gamma_5$ the fifth level energy width, $\Gamma_6$ the sixth level energy width, and $\hbar\omega LO$ the longitudinal optical phonon energy.

19. A photodetector according to claim 18, wherein the amount of said tunnel current is increased as the intensity of the detected light is increased, satisfying the following conditional expressions:

$$|E_1 - E_3| \geq \Gamma_1 + \Gamma_3$$

$$|E_3 - E_5| \geq \Gamma_3 + \Gamma_5.$$

20. A photodetector according to claim 18, wherein the amount of said tunnel current is decreased as the intensity of the detected light is increased, satisfying the following conditional expressions:

$$|E_1 - E_3| < \Gamma_1 + \Gamma_3$$

$$|E_3 - E_5| < \Gamma_3 + \Gamma_5.$$

21. A semiconductor device used in a photodetector adapted to detect light having a predetermined level of photon energy, comprising:

a substrate;

a first semiconductor layer provided on said substrate and having a thickness which is made sufficiently small to allow the generation of a first and a second electron energy level by the quantum size effect, the energy difference between these levels being slightly smaller than the photon energy of the detected light;

a second semiconductor layer provided on said substrate and having a thickness which is made sufficiently small to allow the generation of a third and a fourth quantized electron energy level by the quantum size effect, the energy difference between these levels being slightly larger than the photon energy of the detected light;

a barrier layer provided between said first and second semiconductor layers; and a pair of electrodes for applying voltage to said barrier layer and said first and second semiconductor layers in such a manner as to generate a tunnel current flowing through said barrier layer, and wherein incidence of the detected light upon said first and second semiconductor layers causes the quantized electron energy levels to shift by the optical Stark effect, resulting in variation of said tunnel current.

22. A semiconductor device according to claim 21, wherein the photon energy of the detected light is larger than the longitudinal optical phonon energy.

23. A semiconductor device according to claim 21, wherein the direction of the field vector of the detected light is perpendicular to the planes of said semiconductor layers.

24. A semiconductor device according to claim 21, wherein the amount of said tunnel current is increased as the intensity of the detected light is increased, satisfying the following conditional expression:

$$|E_1 - E_3| \geq \Gamma_1 + \Gamma_3$$

where E1 represents the first level sub-band energy, E3 the third level sub-band energy, $\Gamma_1$ the first level energy width, and $\Gamma_3$ the third level energy width.

25. A semiconductor device according to claim 21, wherein the amount of said tunnel current is decreased as the intensity of the detected light is increased, satisfying the following conditional expression:

$$|E_1 - E_3| < \Gamma_1 + \Gamma_3$$

where $E_1$ represents the first level sub-band energy, $E_3$ the third level sub-band energy, $\Gamma_1$ the first level energy width, and $\Gamma_3$ the third level energy width.

26. A semiconductor device employed in a photodetector adapted to detect light having a predetermined level of photon energy, comprising:
   a substrate;
   a first semiconductor layer provided on said substrate and having a thickness which is made sufficiently small to allow the generation of a first and a second quantized electron energy level by the quantum size effect;
   a second semiconductor layer provided on said substrate and having a thickness which is made sufficiently small to allow the generation of a third and a fourth quantized electron energy level by the quantum size effect;
   a barrier layer provided between said first and second semiconductory layers; and
   a pair of electrodes for applying voltage to said barrier layer and said first and second semiconductor layers in such a manner as to generate a tunnel current flowing through said barrier layer; p1 wherein, assuming that the sub-band energy of the first quantized electron energy level is $E_1$, that the sub-band energy of the second quantized electron energy level is $E_2$, that the sub-band energy of the third quantized electron energy level is $E_3$, that the sub-band energy of the fourth quantized electron energy level is $E_4$, that the photon energy of the detected energy light is $\hbar\omega$, the following conditional expressions are satisfied, and wherein incidence of the detected light upon said first and second semiconductor layers causes the quantized electron energy levels to shift by the optical Stark effect, resulting in variation of said tunnel current:

$$E_2 - E_1 < \hbar\omega < E_1 - E_3$$

$$\hbar\omega = E_2 - E_1 - \delta_1$$

$$\hbar\omega = E_4 - E_3 - \delta_2$$

$$\delta_1 < 0$$

$$\delta_2 > 0$$

$$|\delta_1| >> \hbar\omega$$

$$|\delta_2| >> \hbar\omega.$$

27. A semiconductor device according to claim 26, wherein the direction of the field vector of the detected light is perpendicular to the planes of said semiconductor layers.

28. A semiconductor device according to claim 26, wherein the following conditional expressions are satisfied:

$$|\delta_1| \geq \Gamma_1 + \Gamma_2$$

$$|\delta_2| \geq \Gamma_3 + \Gamma_4$$

$$\hbar\omega >> \hbar\omega LO$$

where $\Gamma_1$ represents the first level energy width, $\Gamma_2$ the second level energy width, $\Gamma_3$ the third level energy width, $\Gamma_4$ the fourth level energy width, and $\hbar\omega LO$ the longitudinal optical phonon energy.

29. A semiconductor device according to claim 28, wherein the amount of said tunnel current is increased as the intensity of the detected light is increased, satisfying the following conditional expression:

$$|E_1 - E_3| \geq \Gamma_1 + \Gamma_3.$$

30. A semiconductor device according to claim 28, wherein the amount of said tunnel current is decreased as the intensity of the detected light is increased, satisfying the following conditional expression:

$$|E_1 - E_3| < \Gamma_1 + \Gamma_3.$$

31. A semiconductor device used in a photodetector adapted to detect light having a predetermined level of photon energy, comprising:
   a substrate;
   a first semiconductor layer provided on said substrate and having a thickness which is made sufficiently small to allow the generation of a first and a second quantized electron energy level by the quantum size effect, the energy difference between these levels being slightly smaller than the photon energy of the detected light;
   a second semiconductor layer provided on said substrate and having a thickness which is made sufficiently small to allow the generation of a third and a fourth quantized electron energy level by the quantum size effect, the energy difference between these levels being slightly larger than the photon energy of the detected light;
   a third semiconductor layer provided on said substrate and having a thickness which is made sufficiently small to allow the generation of a fifth and a sixth quantized electron energy level by the quantum size effect, the energy difference between these levels being slightly smaller than the photon energy of the detected light;
   a first barrier layer provided between said first and second semiconductor layers;
   a second barrier layer provided between said second and third semiconductor layers; and
   a pair of electrodes for applying voltage to said first and second barrier layers and said first, second and third semiconductor layers in such a manner as to generate a tunnel current flowing through said first and second barrier layers;
   wherein incidence of the detected light upon said first, second and third semiconductor layers causes the quantized electron energy levels to shift by the optical Stark effect, resulting in variation of said tunnel current.

32. A semiconductor device according to claim 31, wherein the photon energy of the detected light is larger than the longitudinal optical phonon energy.

33. A semiconductor device according to claim 31, wherein the direction of the field vector of the detected light is perpendicular to the planes of said semiconductor layers.

34. A semiconductor device according to claim 31, wherein the amount of said tunnel current is increased as the intensity of the detected light is increased, satisfying the following conditional expressions:

$$|E1-E3| \geq \Gamma1+\Gamma3$$

$$|E3-E5| \geq \Gamma3+\Gamma5$$

where E1 represents the first level sub-band energy, E3 the third level sub-band energy, E5 the fifth level sub-band energy, $\Gamma1$ the first level energy width, $\Gamma3$ the third level energy width, and $\Gamma5$ the fifth level energy width.

35. A photodetector according to claim 31, wherein the amount of said tunnel current is decreased as the intensity of the detected light is increased, satisfying the following conditional expressions:

$$|E1-E3| < \Gamma1+\Gamma3$$

$$|E3-E5| < \Gamma3+\Gamma5$$

where E1 represents the first level sub-band energy, E3 the third level sub-band energy, E5 the fifth level sub-band energy, $\Gamma1$ the first level energy width, $\Gamma3$ the third level energy width, and $\Gamma5$ the fifth level energy width.

36. A semiconductor device used in a photodetector adapted to detect light having a predetermined level of photon energy, comprising:
 a substrate;
 a first semiconductor layer provided on said substrate and having a thickness which is made sufficiently small to allow the generation of a first and a second quantized electron energy level by the quantum size effect;
 a second semiconductor layer provided on said substrate and having a thickness which is made sufficiently small to allow the generation of a third and a fourth quantized electron energy level by the quantum size effect;
 a third semiconductor layer provided on said substrate and having a thickness which is made sufficiently small to allow the generation of a fifth and a sixth quantized electron energy level by the quantum size effect;
 a first barrier layer provided between said first and second semiconductor layers;
 a second barrier layer provided between said second and third semiconductor layers; a nd
 a pair of electrodes for applying voltage to said barrier layer and said first and second semiconductor layers in such a manner as to generate a tunnel current flowing through said first and second barrier layers;
 wherein, assuming that the sub-band energy of the first quantized electron energy level is $E_1$, that the sub-band energy of the second quantized electron energy level is $E_2$, that the sub-band energy of the third quantized electron energy level is $E_3$, that the sub-band energy of the fourth quantized electron energy level is $E_4$, that the sub-band energy of the fifth quantized electron energy level is $E_5$, that the sub-band energy of the sixth quantized electron energy level is $E_6$, and that the photon energy of the detected light is $\omega$, the following conditional expressions are satisfied, and wherein incidence of the detected light upon said first, second and third semiconductor layers causes the quantized electron energy levels to shift by the optical Stark effect, resulting in variation of said tunnel current:

$$E_2-E_1 < \hbar\omega < E_4-E_3$$

$$E_6-E_5 < \hbar\omega$$

$$\hbar\omega = E_2-E_1-\delta_1$$

$$\hbar\omega = E_4-E_3-\delta_2$$

$$\hbar\omega = E_6-E_5-\delta_3$$

$$\delta_1 < 0$$

$$\delta_2 < 0$$

$$\delta_3 > 0$$

$$|\delta_1| << \hbar\omega$$

$$|\delta_2| << \hbar\omega$$

$$|\delta_1| << \hbar\omega.$$

37. A semiconductor device according to claim 36, wherein the direction of the field vector of the detected light is perpendicular to the planes of said semiconductor layers.

38. A semiconductor device according to claim 36, wherein the following conditional expressions are satisfied:

$$|\delta1| \geq \Gamma1+\Gamma2$$

$$|\delta2| \geq \Gamma3+\Gamma4$$

$$|\delta3| \geq \Gamma5+\Gamma6$$

where $\Gamma1$ represents the first level energy width, $\Gamma2$ the second level energy width, $\Gamma3$ the third level energy width, $\Gamma4$ the fourth level energy width, $\Gamma5$ the fifth level energy width, $\Gamma6$ the sixth level energy width, and $\hbar\omega LO$ the longitudinal optical phonon energy.

39. A semiconductor device according to claim 38, wherein the amount of said tunnel current is increased as the intensity of the detected light is increased, satisfying the following conditional expressions:

$$|E1-E3| \geq \Gamma1+\Gamma3$$

$$|E3-E5| \geq \Gamma3+\Gamma5.$$

40. A semiconductor device according to claim 38, wherein the amount of said tunnel current is decreased as the intensity of the detected light is increased, satisfying the following conditional expressions:

$$|E1-E3| < \Gamma1+\Gamma3$$

$$|E3-E5| < \Gamma3+\Gamma5.$$

41. A semiconductor device used in a photodetector adapted to detect light having a predetermined level of photon energy, comprising:
 a substrate;
 a first semiconductor layer provided on said substrate and having a thickness which is made sufficiently small to allow the generation of a first and a second quantized electron energy level by the quantum size effect, the energy difference between these levels being slightly smaller than the photon energy of the detected light;

a first barrier layer provided on said first semiconductor layer;

a second semiconductor layer provided on said substrate and having a thickness which is made sufficiently small to allow the generation of a third and a fourth quantized electron energy level by the quantum size effect, the energy difference between these levels being slightly larger than the photon energy of the detected light;

a second barrier layer provided on said second semiconductor layer;

a third semiconductor layer provided on said substrate and having a thickness which is made sufficiently small to allow the generation of a fifth and a sixth quantized electron energy level by the quantum size effect, the energy difference between these levels being slightly smaller than the photon energy of the detected light;

a first electrode provided on said third semiconductor layer; and a second electrode provided on the bottom surface of said third semiconductor layer;

wherein application of voltage between said first and second electrodes causes a tunnel current flowing through said first and second barrier layers to be generated, and the incidence of the detected light upon said first, second and third semiconductor layers causes the quantized electron energy levels to shift by the optical Stark effect, resulting in variation of said tunnel current.

42. A semiconductor device according to claim 41, wherein the photon energy of the detected light is larger than the longitudinal optical phonon energy.

43. A semiconductor device according to claim 41, wherein the direction of the field vector of the detected light is perpendicular to the planes of said semiconductor layers.

44. A semiconductor device according to claim 41, wherein the amount of said tunnel current is increased as the intensity of the detected light is increased, satisfying the following conditional expressions:

$$|E1-E3| \geq \Gamma 1 + \Gamma 3$$

$$|E3-E5| \geq \Gamma 3 + \Gamma 5$$

where E1 represents the first level sub-band energy, E3 the third level sub-band energy, $\Gamma 1$ the first level energy width, $\Gamma 3$ the third level energy width, and $\Gamma 5$ the fifth level energy width.

45. A semiconductor device according to claim 41, wherein the amount of said tunnel current is decreased as the intensity of the detected light is increased, satisfying the following conditional expressions:

$$|E1-E3| < \Gamma 1 + \Gamma 3$$

$$|E3-E5| < \Gamma 3 + \Gamma 5$$

where E1 represents the first level sub-band energy, E3 the third level sub-band energy, E5 the fifth level sub-band energy, $\Gamma 1$ the first level energy width, $\Gamma 3$ the third level energy width, and $\Gamma 5$ the fifth level energy width.

46. A semiconductor device according to claim 41, further comprising a first clad layer provided between said substrate and said first semiconductor layer, and a second clad layer provided on said third semiconductor layer.

47. A semiconductor device according to claim 46, further comprising a superlattice buffer layer provided between said substrate and said first clad layer.

48. A semiconductor device according to claim 46, wherein said second clad layer has a stripe-like projection extending in the incidence direction of the detected light.

49. An optical communication system using a photodetector, comprising:

a light signal transmitter adapted to emit light modulated in accordance with a communication signal and having a predetermined level of photon energy; and a light signal receiver adapted to receive the light emitted from said transmitter, said light signal receiver having a photodetector adapted to allow signal light to be further transmitted and to detect this signal light;

said photodetector comprising:

a first semiconductor layer;

a second semiconductor layer having a quantum well or a quantum wire structure and exhibiting a plurality of quantized electron energy levels the energy difference between which is slightly smaller or slightly larger than the photon energy of the detected light;

a barrier layer provided between said first and second semiconductor layers;

a means for applying voltage to said barrier layer and said first and second semiconductor layers in order to generate a tunnel current flowing through said barrier layer; and a means for detecting said tunnel current;

wherein incidence of the detected light upon said second semiconductor layer causes the quantized electron energy levels to shift by the optical Stark effect, resulting in variation of said tunnel current.

50. An optical communication system according to claim 49, wherein the photon energy of the detected light is larger than the longitudinal optical phonon energy.

51. An optical communication system according to claim 49, wherein the direction of the field vector of the detected light is perpendicular to the plane of said second semiconductor layer.

52. An optical communication system according to claim 49, further comprising a photoconductive waveguide for transmitting a light signal from said transmitter to said receiver.

53. An optical communication system according to claim 49, wherein said receiver has a signal demodulator circuit adapted to demodulate said communication signal from the current detected by said photodetector.

* * * * *

UNITED STATES PATENT AND TRADEMARK OFFICE
CERTIFICATE OF CORRECTION

PATENT NO. : 5,321,275

DATED : June 14, 1994

INVENTOR(S) : AKIRA SHIMIZU, ET AL.

It is certified that error appears in the above-identified patent and that said Letters Patent is hereby corrected as shown below:

IN THE DRAWINGS

Sheet 4 of 6, FIG. 4, "MURTI-PHONON" should read --MULTI-PHONON--.

COLUMN 4

Line 13, "arc" should read --are--.
Line 14, "$\omega$," should read --$\hbar\omega$,--.
Line 31, "herein" should read --herein,--.

COLUMN 6

Line 55, "241, 242," should read --$24_1$, $24_2$,--.
Line 58, "251, 252," should read --$25_1$, $25_2$,--.
Line 61, "251" should read --$25_1$--.
Line 64, "252" should read --$25_2$--.
Line 65, "252" should read --$25_2$--.

COLUMN 7

Line 3, "251" should read $25_1$--.
Line 4, "252" should read --$25_2$-- and "261" should read --$26_1$--.
Line 5, "262" should read --$26_2$-- and "271" should read --$27_1$--.
Line 6, "272" should read --$27_2$--.
Line 8, "281 and 282." should read --$28_1$ and $28_2$--.

COLUMN 8

Line 67, "$\omega$," should read --$\hbar\omega$,--.

UNITED STATES PATENT AND TRADEMARK OFFICE
CERTIFICATE OF CORRECTION

PATENT NO. : 5,321,275
DATED : June 14, 1994
INVENTOR(S) : AKIRA SHIMIZU, ET AL.

It is certified that error appears in the above-identified patent and that said Letters Patent is hereby corrected as shown below:

COLUMN 9

Line 5, "$E_2-E_1<\omega<E_4-E_3$" should read --$E_2-E_1<\hbar\omega<E_4-E_3$--.
Line 15, "$|\delta_1|>>\hbar\omega$" should read --$|\delta_1|<<\hbar\omega$--.
Line 16, "$|\delta_2|>>\hbar\omega$" should read --$|\delta_2|<<\hbar\omega$--.
Line 27, "$|81|\geq\Gamma_3+\Gamma_4$" should read --$|\delta_2|\geq\Gamma_3+\Gamma_4$
  $\hbar\omega>>\hbar\omega LO$--.
Line 37, "condition" should read --conditional--.

COLUMN 10

Line 32, "expression." should read --expression:--.
Line 53, "$\Gamma_3$:" should read --$\Gamma_3$--.

COLUMN 11

Line 25, "$\omega$," should read --$\hbar\omega$,--.
Line 45, "$\delta_3>0$" should read --$\delta_3<0$--.

COLUMN 12

Line 28, "second" should read --second quantized--.
Line 45, "layer, and" should read --layer; and--.

COLUMN 13

Line 26, "semiconductory" should read --semiconductor--.
Line 30, "pl" should be deleted.
Line 54, "$|\delta_1|>>\hbar\omega$" should read --$|\delta_1|<<\hbar\omega$--.
Line 56, "$|\delta_2|>>\hbar\omega$." should read --$|\delta_2|<<\hbar\omega$.--.

UNITED STATES PATENT AND TRADEMARK OFFICE
CERTIFICATE OF CORRECTION

PATENT NO. : 5,321,275
DATED : June 14, 1994
INVENTOR(S) : AKIRA SHIMIZU, ET AL.

Page 3 of 3

It is certified that error appears in the above-identified patent and that said Letters Patent is hereby corrected as shown below:

<u>COLUMN 15</u>

Line 50, "a nd" should read --and--.
    Line 66, "$\omega$," should read --$\hbar\omega$,--.

<u>COLUMN 16</u>

Line 16, "$\delta_2<0$" should read --$\delta_2>0$--.
    Line 18 "$\delta_3<0$" should read --$\delta_3>0$--.

<u>COLUMN 17</u>

Line 53, "energy $\Gamma_1$" should read --energy, $E_5$ the fifth level sub-band energy, $\Gamma_1$--.

Signed and Sealed this

Twenty-eight Day of February, 1995

Attest:

BRUCE LEHMAN

*Attesting Officer*      *Commissioner of Patents and Trademarks*